(12) United States Patent
Platt et al.

(10) Patent No.: US 9,448,280 B2
(45) Date of Patent: Sep. 20, 2016

(54) CIRCUIT TEST SYSTEM AND METHOD USING A WIDEBAND MULTI-TONE TEST SIGNAL

(75) Inventors: Timothy M. Platt, Williston, VT (US); Mustapha Slamani, South Burlington, VT (US); Tian Xia, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 1209 days.

(21) Appl. No.: 13/407,811

(22) Filed: Feb. 29, 2012

(65) Prior Publication Data

US 2013/0226499 A1 Aug. 29, 2013

(51) Int. Cl.
G06F 19/00 (2011.01)
G01R 31/3167 (2006.01)
G01R 31/28 (2006.01)

(52) U.S. Cl.
CPC ....... *G01R 31/3167* (2013.01); *G01R 31/2837* (2013.01)

(58) Field of Classification Search
CPC .......................... G06F 19/00; G01R 31/3167
USPC .......................... 702/117; 714/733, 738, 740
See application file for complete search history.

(56) References Cited

U.S. PATENT DOCUMENTS

| 5,408,201 | A | 4/1995 | Uriya |
| 6,185,594 | B1 | 2/2001 | Hilton et al. |
| 6,526,365 | B1 * | 2/2003 | Marino ................ G01R 27/28 340/870.14 |
| 6,587,671 | B1 | 7/2003 | Kanago et al. |
| 6,747,946 | B1 | 6/2004 | Kaneko et al. |
| 6,816,453 | B1 * | 11/2004 | Sakamoto ........... H04L 27/2602 370/210 |
| 6,897,670 | B2 | 5/2005 | Burns |
| 7,162,207 | B2 | 1/2007 | Kursula et al. |
| 7,313,193 | B2 | 12/2007 | Laroia |

(Continued)

FOREIGN PATENT DOCUMENTS

WO 2011066778 A1 6/2011

OTHER PUBLICATIONS www.Agilent.com/find/uwb, "Agilent Technologies Solutions for MB-OFDM Ultra-wideband," Application Note, Agilent Technologies, Aug. 10, 2008, pp. 1-12.

(Continued)

*Primary Examiner* — Hyun Park
*Assistant Examiner* — Mohammad Islam
(74) *Attorney, Agent, or Firm* — Gibb & Riley, LLC; Steven J. Meyers, Esq.

(57) ABSTRACT

A testing system and method incorporate a test signal generator for generating a test signal with multiple tones uniformly distributed across a wideband having a specific bandwidth. This test signal is generated based on user-specified test signal parameter(s) (e.g., using an orthogonal frequency-division multiplexing (OFDM) spread spectrum technique) and processed (e.g., converted from digital to analog or shifted to a different wideband having the same bandwidth), as necessary, so that it is suitable for application to a specific device under test and so that the tones account for the full range of frequencies with the wideband operation of that device under test. After it is applied to the device under test, the resulting output signal is captured, processed (e.g., converted back to digital or shifted back to the initial wideband), as necessary, and analyzed in order to determine the frequency responses associated with each of the tones.

18 Claims, 6 Drawing Sheets

(56) References Cited

U.S. PATENT DOCUMENTS

| | | | |
|---|---|---|---|
| 7,386,069 B2 | 6/2008 | Yang et al. | |
| 7,428,683 B2* | 9/2008 | Dai | G01R 31/31813 714/733 |
| 7,940,847 B2 | 5/2011 | Liang et al. | |
| 2002/0097036 A1* | 7/2002 | Bradley | G01R 3/16 324/76.19 |
| 2002/0123869 A1* | 9/2002 | Koppl | G01R 31/2848 703/4 |
| 2003/0050014 A1* | 3/2003 | Cain | H04B 17/20 455/67.11 |
| 2004/0086027 A1* | 5/2004 | Shattil | H04L 25/03834 375/146 |
| 2005/0021261 A1* | 1/2005 | Nara | G01R 35/003 702/75 |
| 2005/0186929 A1 | 8/2005 | Rathbun, Jr. | |
| 2005/0275395 A1* | 12/2005 | Yoshihara | G01R 27/28 324/76.12 |
| 2006/0052075 A1 | 3/2006 | Galivanche et al. | |
| 2006/0247543 A1 | 11/2006 | Cornish et al. | |
| 2007/0047669 A1* | 3/2007 | Mak | H03D 3/007 375/316 |
| 2007/0093227 A1* | 4/2007 | Lieback | H03M 1/122 455/276.1 |
| 2007/0099570 A1* | 5/2007 | Gao | H04B 1/30 455/63.1 |
| 2008/0090531 A1* | 4/2008 | Jungerman | H04L 27/364 455/126 |
| 2010/0013455 A1 | 1/2010 | Kelma et al. | |
| 2010/0080312 A1* | 4/2010 | Moffatt | H04B 1/713 375/260 |
| 2010/0183083 A1 | 7/2010 | Miki et al. | |
| 2010/0197257 A1* | 8/2010 | Rajkotia | H04B 1/1036 455/188.1 |
| 2010/0215089 A1 | 8/2010 | Osumi | |
| 2011/0041027 A1* | 2/2011 | Fong | H04L 1/1812 714/749 |
| 2011/0099424 A1 | 4/2011 | Rivera Trevino et al. | |
| 2015/0145528 A1* | 5/2015 | Yeo | G01R 23/00 324/629 |

OTHER PUBLICATIONS

Agilent Technologies, "Generation and Conditioning of Multitone Test Signals," Microwave Design & Measurement Seminar, Dec. 2002, 24 pages.

* cited by examiner

CIRCUIT TEST SYSTEM AND METHOD USING A WIDEBAND MULTI-TONE TEST SIGNAL

BACKGROUND

1. Field of the Invention

The embodiments disclosed herein relate to circuit testing and, more specifically, to a circuit test system and method using a wideband multi-tone test signal.

2. Description of the Related Art

Recent innovations in integrated circuit technology and design have enabled the expanding growth of wireless communication systems and have further led to various wireless communication standards, which employ different spectrums and protocols for providing wireless communication services (e.g., wireless voice and data communication services). Typically, the integrated circuit components in wireless communication systems have wideband operation (i.e., operate at bandwidths of 500 kHz to 20 GHz) or ultra-wideband operation (i.e., operate at 20 GHz and beyond). Consequently, in order to accurately test such integrated circuit components, the frequency response must be characterized across the full frequency bandwidth (i.e., across the full range of operating frequencies within the wideband). Unfortunately, characterizing the frequency response across the full frequency bandwidth of a circuit component can be costly in terms of total testing time required and/or additional hardware required.

SUMMARY

In view of the foregoing, disclosed herein are embodiments of a circuit testing system and an associated method that incorporate a programmable test signal generator capable of generating a test signal that has multiple tones uniformly distributed across a wideband with a specific bandwidth such that adjacent tones are all separated by a same frequency spacing. This test signal can be generated based on at least one user-specified test signal parameter and using, for example, an orthogonal frequency-division multiplexing (OFDM) spread spectrum technique. Once generated, this test signal can be processed (e.g., converted from digital to analog or shifted to a different wideband having the same bandwidth), as necessary, so that it is suitable for application to the specific device under test and so that the tones account for the full range of frequencies with the wideband operation of that device under test. Then, the multi-tone test signal can be applied to the device under test and the output signal from the device under test can be captured. The resulting output signal can be processed, as necessary (e.g., converted back to digital or shifted back to the initial wideband) and then analyzed. Specifically, the tones of this output signal can be analyzed in order to determine the various frequency responses associated with each of the tones. Consequently, the embodiments allow the full frequency bandwidth of the device under test to be characterized in a minimal amount of time and without a significant increase in hardware.

More particularly, disclosed herein are embodiments of a circuit testing system. The embodiments of the testing system can comprise at least a programmable test signal generator, a device under test and an analyzer. The programmable test signal generator can generate a test signal, based on one or more user-specified test signal parameters (e.g., a user-specified wideband, a user-specified number of tones, and/or a user-specified amount of spacing between adjacent tones) such that the resulting test signal has multiple tones, which are uniformly distributed across a wideband having a specific bandwidth. This can be accomplished, for example, by using an orthogonal frequency-division multiplexing (OFDM) spread spectrum technique and, particularly, by performing an inverse Fourier transform (IFT) operation. The device under test can process the multi-tone test signal and, in response to the multi-tone test signal, can output an output signal. Finally, the analyzer can analyze the output signal and, particularly, the tones thereof (e.g., by performing a discrete Fourier transform (DFT) operation on the output signal) in order to determine the various frequency responses associated with each of the tones.

One embodiment of the circuit testing system can further comprise additional components that can process the test and output signals, as necessary, to accommodate testing of an analog device as opposed to a digital device. Specifically, one embodiment of the testing system can comprise a programmable test signal generator, a digital-to-analog converter, an analog device under test, an analog-to-digital converter and an analyzer. The programmable test signal generator can generate a digital test signal, based on one or more user-specified test signal parameters (e.g., a user-specified wideband, a user-specified number of tones, and/or a user-specified amount of spacing between adjacent tones). This digital test signal can have a specific number of tones uniformly distributed across a wideband having a specific bandwidth and can be generated in the same manner as discussed above (e.g., by using an orthogonal frequency-division multiplexing (OFDM) spread spectrum technique and, particularly, by performing an inverse Fourier transform (IFT) operation). The digital-to-analog converter can convert the digital test signal into an analog test signal. The analog device under test can process the analog test signal and, in response to the analog test signal, can output an analog output signal. The analog-to-digital converter can then convert the analog output signal into a digital output signal. Finally, the analyzer can analyze the digital output signal and, particularly, the tones thereof in the same manner as discussed above (e.g., by performing a discrete Fourier transform (DFT) operation on the digital output signal) in order to determine the various frequency responses associated with each of the tones.

Also disclosed herein are embodiments of a circuit testing method. The method embodiments can comprise generating a test signal, based on one or more user-specified test signal parameters (e.g., a user-specified wideband, a user-specified number of carriers, and/or a user-specified amount of spacing between adjacent tones) such that the resulting test signal has multiple tones, which are uniformly distributed across a wideband with a specific bandwidth. This can be accomplished, for example, by using an orthogonal frequency-division multiplexing (OFDM) spread spectrum technique and, particularly, by performing an inverse Fourier transform (IFT) operation. The multi-tone test signal can be applied to the device under test, which processes it and, in response, outputs an output signal. Finally, the output signal and, particularly, the tones thereof can be analyzed (e.g., by performing a discrete Fourier transform (DFT) operation on the output signal) in order to determine the various frequency responses associated with each of the tones.

One embodiment of the circuit testing method can further comprise performing additional processes on the test and output signals, as necessary, to accommodate testing of an analog device as opposed to a digital device. Specifically, one embodiment of the circuit testing method can comprise performing generating, based on one or more user-specified test signal parameters, a digital test signal. This digital test signal can have a specific number of tones uniformly distributed across a wideband having a specific bandwidth and can be generated in the same manner as discussed above (e.g., by using an orthogonal frequency-division multiplexing (OFDM) spread spectrum technique and, particularly, by performing an inverse Fourier transform (IFT) operation). The digital test signal can then be converted into an analog test signal. The analog test signal can then be applied to the device under test, which process it and outputs an analog output signal. The analog output signal can then be converted into a digital output signal. Finally, the digital output signal and, particularly, the tones thereof can be analyzed in the same manner as discussed above (e.g., by performing a discrete Fourier transform (DFT) operation on the output signal) in order to determine the various frequency responses associated with each of the tones.

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, recent innovations in integrated circuit technology and design have enabled the expanding growth of wireless communication systems and have further led to various wireless communication standards, which employ different spectrums and protocols for providing wireless communication services (e.g., wireless voice and data communication services). Typically, the integrated circuit components in wireless communication systems have wideband operation (i.e., operate at bandwidths of 500 kHz to 20 GHz) or ultra-wideband operation (i.e., operate at 20 GHz and beyond). Consequently, in order to accurately test such integrated circuit components, the frequency response must be characterized across the full frequency bandwidth (i.e., across the full range of operating frequencies within the wideband). Unfortunately, characterizing the frequency response across the full frequency bandwidth of a circuit component can be costly in terms of total testing time required and/or additional hardware required.

For example, one technique for characterizing the frequency response across the full frequency bandwidth can employ a signal generator with single phase-locked loop (PLL) to output a test signal. The multi-tone test signal can be applied to the circuit component and the response can be measured. A frequency divider in the PLL can further be repeatedly adjusted in order to consecutively generate multiple test signals having different frequencies. The frequency response of the circuit component to each of these test signals can be measured. By assembling all of the test results at all the frequency points, the full frequency bandwidth of the circuit component can be characterized. However, this technique is costly in terms of required testing time because the test signal at the different frequency points must be generated consecutively and because the frequency response of the integrate circuit component must be measured and examined at each frequency point individually. Thus, as the bandwidth and/or the number of frequency points increases so does the required testing time.

Another technique for characterizing the frequency response across the frequency bandwidth can use multiple different phase-locked loops (PLLs) to simultaneously generate multiple tone signals having different frequencies. These multiple tone signals can be applied to the circuit component simultaneously and the frequency response of the circuit component can be measured and characterized. While the testing time is reduced with this technique because the test signals at the different frequency points are generated and applied to the circuit component simultaneously, it is costly in terms of the required additional hardware (i.e., the multiple PLLs) to produce the multiple test signals at the different frequency points.

In view of the foregoing, disclosed herein are embodiments of a circuit testing system and an associated method that incorporate a programmable test signal generator capable of generating a test signal that has multiple tones uniformly distributed across a wideband with a specific bandwidth such that adjacent tones are all separated by a same frequency spacing. This test signal can be generated based on at least one user-specified test signal parameter and using, for example, an orthogonal frequency-division multiplexing (OFDM) spread spectrum technique. Once generated, this test signal can be processed (e.g., converted from digital to analog or shifted to a different wideband having the same bandwidth), as necessary, so that it is suitable for application to the specific device under test and so that the tones account for the full range of frequencies with the wideband operation of that device under test. Then, the multi-tone test signal can be applied to the device under test and the output signal from the device under test can be captured. The resulting output signal can be processed, as necessary (e.g., converted back to digital or shifted back to the initial wideband) and then analyzed. Specifically, the tones of this output signal can be analyzed in order to determine the various frequency responses associated with each of the tones. Consequently, the embodiments allow the full frequency bandwidth of the device under test to be characterized in a minimal amount of time and without a significant increase in hardware.

Figure 1:
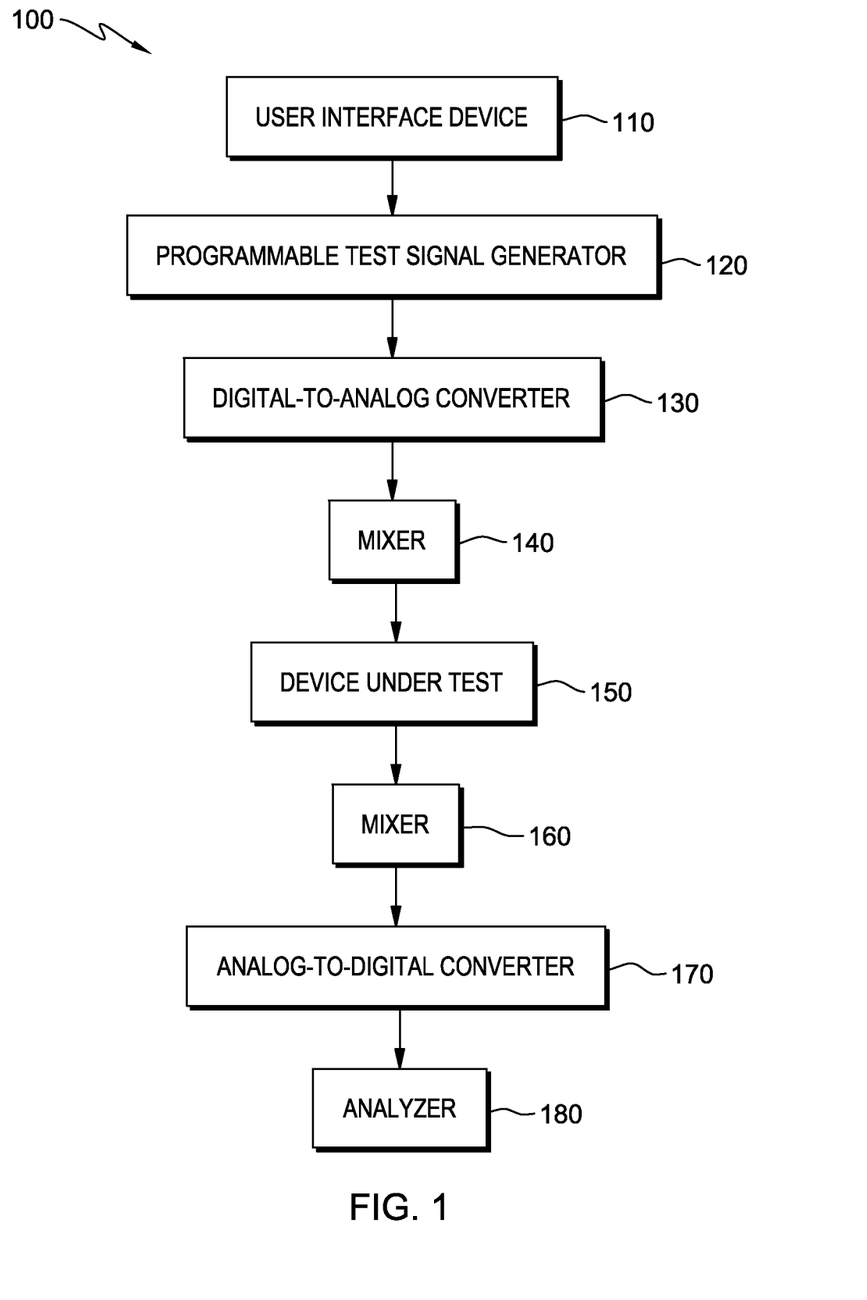
FIG. 1 is a schematic diagram illustrating an embodiment of a circuit testing system.

More particularly, referring to FIG. 1, disclosed herein are embodiments of a circuit testing system 100. This testing system 100 can comprise at least a device under test 150, a programmable test signal generator 120 with a user interface device 110 and an analyzer 180.

The device under test 150 can comprise a component of a circuit with wideband (i.e., at bandwidths of 500 kHz to 20 GHz) or ultra-wideband (i.e., 20 GHz and beyond) operation. The device under test 150 can, for example, comprise a band-pass filter, such as a low band-pass finite impulse response (FIR) filter that blocks relatively high frequencies or a high band-pass filter that blocks relatively low frequencies.

The user interface device 110 can receive, from a user, one or more test signal parameters for a desired multi-tone test signal (i.e., a multi-subcarrier test signal or a frequency agile test signal). These test signal parameters may vary depending upon the type of device under test and the desired performance parameters thereof. Specifically, these test signal parameters can comprise a user-specified wideband (i.e., a user specified range of frequencies), a user-specified number of tones, and/or a user-specified amount of spacing between adjacent tones so that the tones within the multi-tone test signal will account for the full range of frequencies with the wideband operation of that device under test. Those skilled in the art will recognize that a wideband is a specific range of operating frequencies and the bandwidth of the wideband is the difference between the highest and lowest frequencies in that range.

The programmable test signal generator 120 can generate (i.e., can be adapted to generate, configured to generate, programmed to generate, etc.) a test signal and, particularly, a digital test signal, based on the user-specified test signal parameters such that the resulting test signal has a multiple tones (i.e., has multiple subcarriers), which are uniformly distributed across a wideband having a specific bandwidth.

Figure 2:
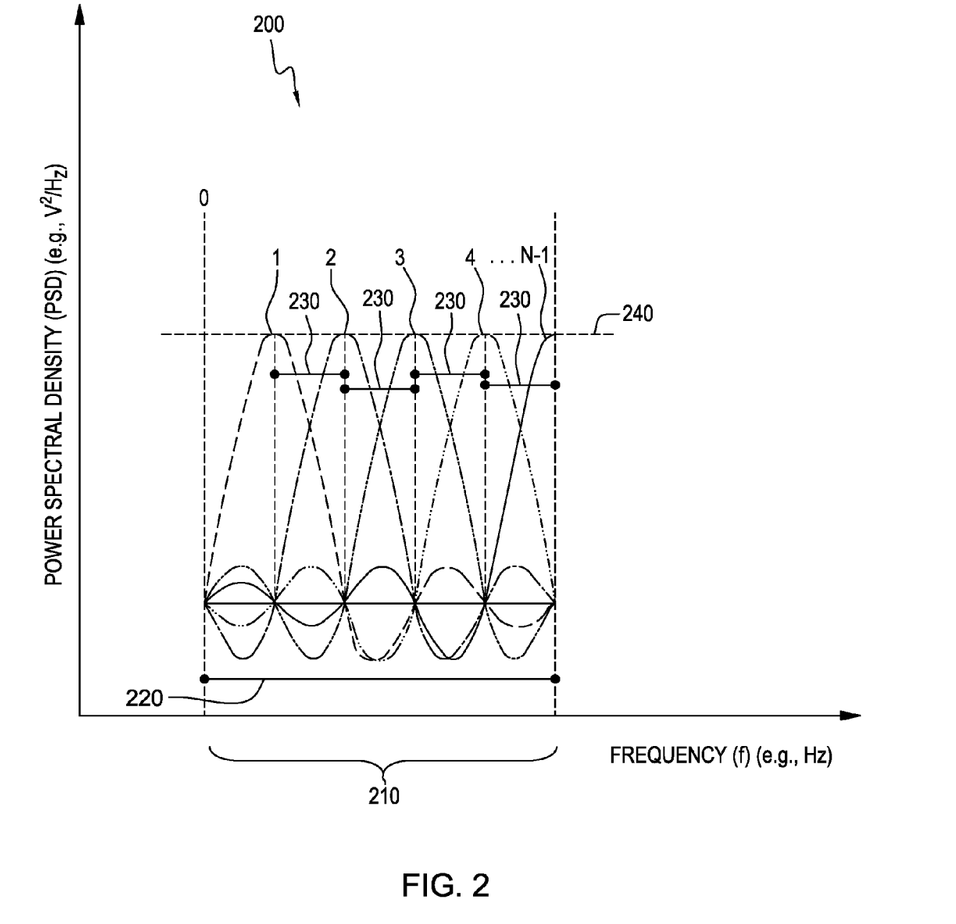
FIG. 2 is a graph illustrating the frequency (f) to power spectral density (PSD) of an exemplary test signal.

FIG. 2 is a graph illustrating the frequency (f) (e.g., as measured in Hertz (Hz)) to power spectral density (PSD) (e.g., as measured in volts squared per Hertz ($V^2$/Hz)) of an exemplary test signal 200 that can be generated by the test signal generator 120 of FIG. 1. As illustrated, this test signal 200 has multiple tones and, particularly, a number N of tones uniformly distributed across a wideband 210 (i.e., a range of frequencies) having a specific bandwidth 220. That is, each tone 1 to N is separated from adjacent tones by the same frequency spacing ($f_a$) 230 (i.e., tone 1 is separated from tone 2 by frequency spacing 230; tone 2 is separated from tone 3 by the same amount of frequency spacing 230; and so on). Thus, the bandwidth 220 (also referred to herein as the sampling frequency bandwidth ($F_s$)) of the wideband 210 can be expressed as follows:

$$F_s = f_a * N. \quad (1)$$

In one embodiment, the programmable test signal generator 120 can generate (i.e., can be adapted to generate, can be configured to generate, can be programmed to generate, etc.) such a multi-tone test signal 200 by using an orthogonal frequency-division multiplexing (OFDM) spread spectrum technique and, particularly, by performing an inverse Fourier transform (IFT) operation, such as an inverse discrete Fourier transform (IDFT) or an inverse fast Fourier transform (IFFT).

For example, for a desired wideband test signal having N tones and a uniform frequency spacing ($f_a$), the tone frequency ($f_k$) can be expressed as follows:

$$f_k = k * f_a, k=0,1,2, \ldots N-1. \quad (2)$$

Therefore, for an input data vector $X_k$, k=0, 1, 2, . . . N−1, its corresponding inverse discrete Fourier transform (IDFT) can be expressed as follows:

$$x(t) = \frac{1}{N} \sum_{k=0}^{N-1} X_k e^{j2\pi k f_a t}. \quad (3)$$

In this case, to sample signal x(t) with the sampling frequency bandwidth of $F_s$, let $t = nT_s = n/F_s$. Thus, the following can be obtained:

$$x(nT_s) = \frac{1}{N} \sum_{k=0}^{N-1} X_k e^{j2\pi k f_a nT_s}. \quad (4)$$

Furthermore, when the minimum sampling frequency bandwidth $F_s$ equals N times the frequency spacing $f_a$, orthogonality among different tones can be accomplished. In other words, inter-tone (i.e., inter-carrier) interference can be eliminated. Correspondingly, the resulting signal can be expressed as:

$$x(nT_s) = \frac{1}{N} \sum_{k=0}^{N-1} X_k e^{j2\pi k f_a nT_s} \quad (5)$$

$$= \frac{1}{N} \sum_{k=0}^{N-1} X_k e^{j2\pi nk/N},$$

$$n = 0, 1, 2, \ldots N,$$

where $x(nT_s)$ is the time domain multi-tone signal whose frequency spectrum has N tones that are uniformly spaced by frequency spacing $f_a$ over the sampling frequency bandwidth $F_s$.

In one embodiment, the magnitude 240 of each of the multiple tones 1 to N can be the same (as shown in FIG. 2). Specifically, the input data vector can be created in quadrature phase shift keying (QPSK) form so that all QPSK vector elements have equal magnitude and, thereby so that all of the tones in the resulting test signal generated by the test signal generator 120 have the same magnitude. Those skilled in the art will recognize that having all the tones in the test signal of equal magnitude allows for a more simplified analysis of the output signal and, particularly, the frequency response from the device under test 150. Alternatively, the magnitude of any one or more of the tones 1 to N may be varied (i.e., at least two of the tones may have different magnitudes), e.g., using customized input data vector generation or other modulation schemes, to allow for a more complex analysis of the resulting frequency response of the device under test.

Consequently, it should be understood that to meet different test requirements, test signal generation by the programmable test signal generator 120 can be adaptively configured to achieve various specifications given that $F_s$ should always equal $f_a * N$. For example, if the sampling frequency bandwidth ($F_s$) is fixed, the frequency resolution (i.e., the frequency spacing ($f_a$)) can be selectively tuned (i.e., varied, adjusted, etc.) and will result in a corresponding change in the number N of tones within the test signal such that $F_s = f_a * N$ or vice versa. Thus, by changing the length of input data vectors (N) and performing N-point IDFT, the frequency resolution (i.e., the frequency spacing ($f_a$)) will be changed such that $F_s = f_a * N$. Alternatively, if the frequency resolution (i.e., the frequency spacing ($f_a$)) is fixed, the sampling frequency bandwidth ($F_s$) can be tuned (i.e., varied, adjusted, etc.) and can result in a corresponding change in the number N of tones within the test signal such that $F_s = f_a * N$ or vice versa. Alternatively, any two of the number of tones, the frequency resolution (i.e., the frequency spacing ($f_a$)) and the sampling frequency bandwidth ($F_s$) can be selectively tuned (i.e., varied, adjusted, etc.) and can result in a corresponding change in the remaining variable such that $F_s = f_a * N$.

Referring to again to FIG. 1, the device under test 150 can process the multi-tone test signal (e.g., can filter the multitone test signal in the case of a pass-band filter) and, in response to the multi-tone test signal, can output a unique output signal.

Finally, the analyzer 180 (i.e., a frequency analysis tool) can analyze (i.e., can be adapted to analyze, configured to analyze, programmed to analyze, etc.) the output signal from the device under test 150 and, particularly, the tones thereof in order to determine the various frequency responses associated with each of the tones. Specifically, the analysis performed by the analyzer 180 can include, but is not necessarily limited to, frequency spectrum, amplitude and/or phase analyses. This can be accomplished, for example, by performing a discrete Fourier transform (DFT) operation on the output signal so that the frequency response at each tone (i.e., at each sub-carrier frequency) within the wideband can be characterized concurrently and rapidly. Those skilled in the art will recognize that, since the technique for generating a test signal, as described above, is performed such that the sampling frequency bandwidth ($F^s$) equals the total signal bandwidth, the Nyquist frequency (i.e., the highest frequency that can be coded at a given sampling rate in order to be able to fully reconstruct the signal) will be halved. However, since a property of the resulting test signal is also frequency orthogonality or zero inter-carrier interference, the frequency response of the device under test at the tone frequency points can still be characterized correctly by performing the above-mentioned discrete Fourier transform (DFT) operation.

Figure 3:
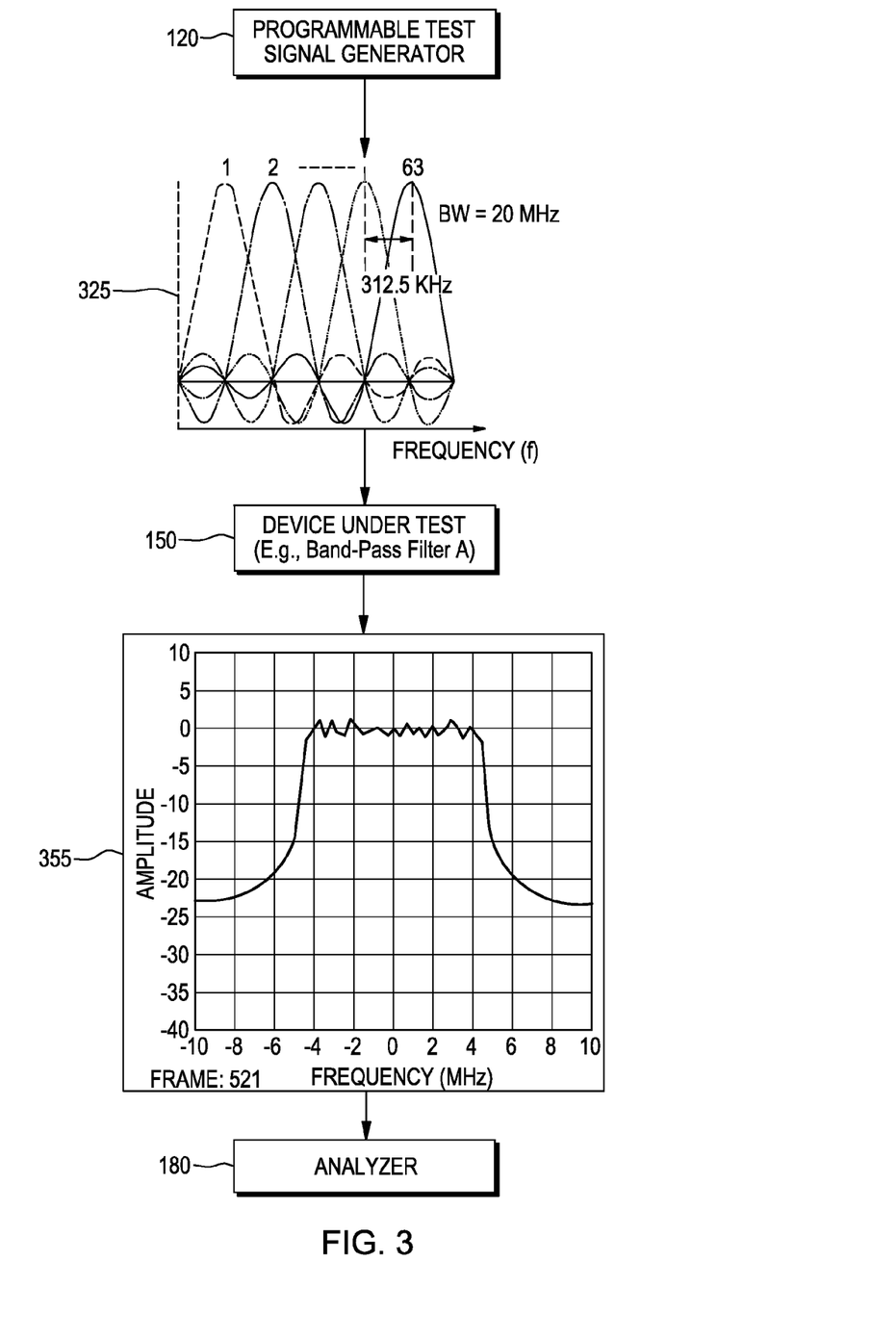
FIG. 3 illustrates testing of a first device under test by the circuit testing system of FIG. 1.
Figure 4:
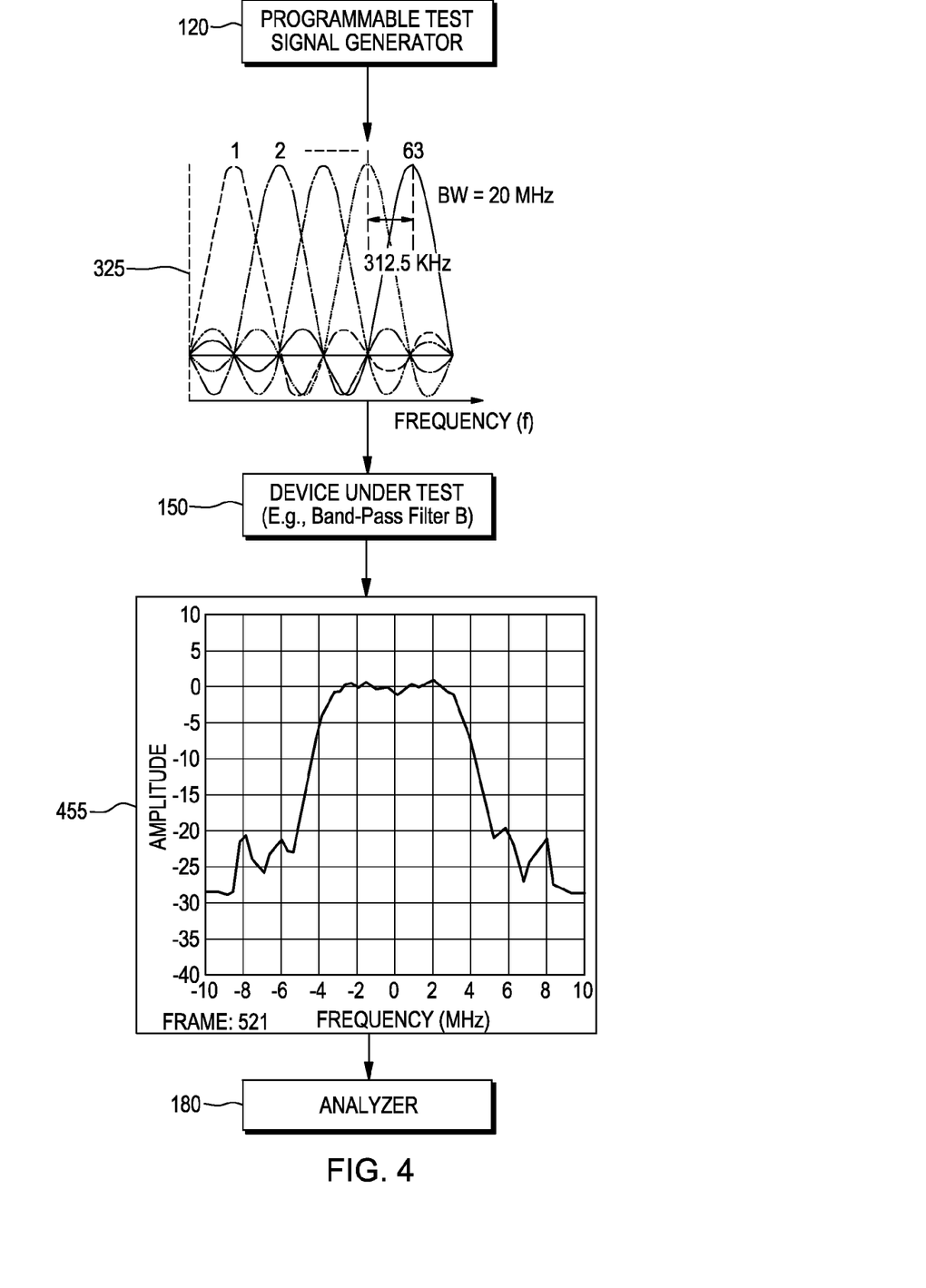
FIG. 4 illustrates testing of a second device under test by the circuit testing system of FIG. 1.

It should be noted that different devices under test will have different frequency responses to the same test signal, thereby allowing the differences in the performances of these devices to be clearly characterized. For example, two different digital finite impulse response (FIR) low pass-band filters can be selected for characterization using the above-described testing system: (1) a digital low band-pass FIR filter A, having a 4 MHz pass band, a 5 MHz stop band and an order number of 30 (see FIG. 3); and (2) a different digital low band-pass FIR filter B, having a 3 MHz pass band, a 5 MHz stop band and an order number of 10 (see FIG. 4). For both devices A and B, a 64-data vector and the 64-point inverse discrete Fourier transform (IDFT) can be used by the programmable test signal generator 120 to generate a multi-tone test signal 325, where the system sampling clock is set to 20 MHz. The resulting test signal 325 will have 64 tones, a bandwidth ($F_s$) of 20 MHz and a frequency spacing ($f_a$) of 312.5 KHz. This test signal 325 can be applied to each of the devices (i.e., to digital low band-pass FIR filter A, as shown in FIG. 3, and to digital low band-pass FIR filter B, as shown in FIG. 4). The analyzer 180 can receive and independently analyze the different output signals 355, 455 from the different devices A and B. Specifically, each of the output signals 355 and 455 can independently undergo a 64-point discrete Fourier transform (DFT) computation. The resulting power spectrums can be calculated and displayed. Thus, by applying the same test signal 325 to the different devices A and B, the differences in their performances can be clearly characterized.

Referring again to FIG. 1, as described above, the test signal generator 120 can generate (i.e., can be adapted to generate, can be configured to generate, etc.) a test signal and, particularly, a digital test signal. This digital test signal can be applied directly to a device under test 150 and, particularly, directly to a digital device. Furthermore, the analyzer 180 can capture the output signal from the digital device and, particularly, can capture the digital output signal directly from the digital device and can analyze that digital output signal. However, optionally, the test system 100 can comprise additional components that can process the multi-tone test signal prior to application to the device under test 150 and that can further process the output signal from the device under test 150 prior to analysis by the analyzer 180, as necessary, in order to allow for testing when the device under test 150 is an analog device as opposed to a digital device. Specifically, in order to accommodate testing of an analog device (e.g., an analog band-pass filter), additional components, such as a digital-to-analog converter 130 and an analog-to-digital converter 170, must be incorporated into the testing system 100. The digital-to-analog converter 130 can convert (i.e., can be adapted to convert, configured to convert, etc.) the digital test signal output by the test signal generator 120 into an analog test signal prior to application to an analog device under test. The analog device under test can then process the analog test signal and, in response to the analog test signal, can output an analog output signal. The analog-to-digital converter 170 can then convert the analog output signal into a digital output signal prior to capture and analysis by the analyzer 180.

Additionally, as described above, the test signal generator 120 can generate (i.e., can be adapted to generate, can be configured to generate, etc.) a test signal having a desired wideband that corresponds to the wideband operation of the specific device under test. That is, the test signal generator 120 can be programmable so as to allow for generation of test signals with selectively different (i.e., selectively variable, selectively adjustable, etc.) widebands. However, alternatively, the programmable test signal generator 120 can generate (i.e., can be adapted to generate, can be configured to generate, can be programmed to generate, etc.) a test signal simply having a specific bandwidth (i.e., the same bandwidth as that of the wideband operation of the device under test). For example, the test signal generator 120 may operate (i.e., be adapted to operate, configured to operate, etc.) only within a fixed band such that any test signal generated is within that fixed band. In this case, additional components can be incorporated into the test system 100 to shift the wideband of the multi-tone test signal and output signals, as necessary, to allow for testing within a desired wideband.

Specifically, as discussed above, the wideband of the multi-tone test signal as generated by the test signal generator 120 can have a specific bandwidth. It can further have a first central frequency (i.e., a frequency point at the center of the wideband). A first shifter 140 can be connected between the programmable test signal generator 120 (or digital-to-analog converter, if applicable) and the device under test 150. Before the multi-tone test signal is applied to the device under test 150, this first shifter 140 can shift (i.e., can be adapted to shift, configured to shift, etc.) the wideband of the multi-tone test signal so that it has a second central frequency, which corresponds to the central frequency of the wideband operation of the device under test 150. Additionally, a second shifter 160 can be connected between the device under test 150 and the analyzer 180 (or the analog-to-digital converter 170, if applicable). Before the output signal of the device under test 150 is processed by the analyzer 180, the second shifter 160 can shift the wideband of the output signal back so that it has the same central frequency as the originally generated test signal (i.e., the first central frequency).

Figure 5A:
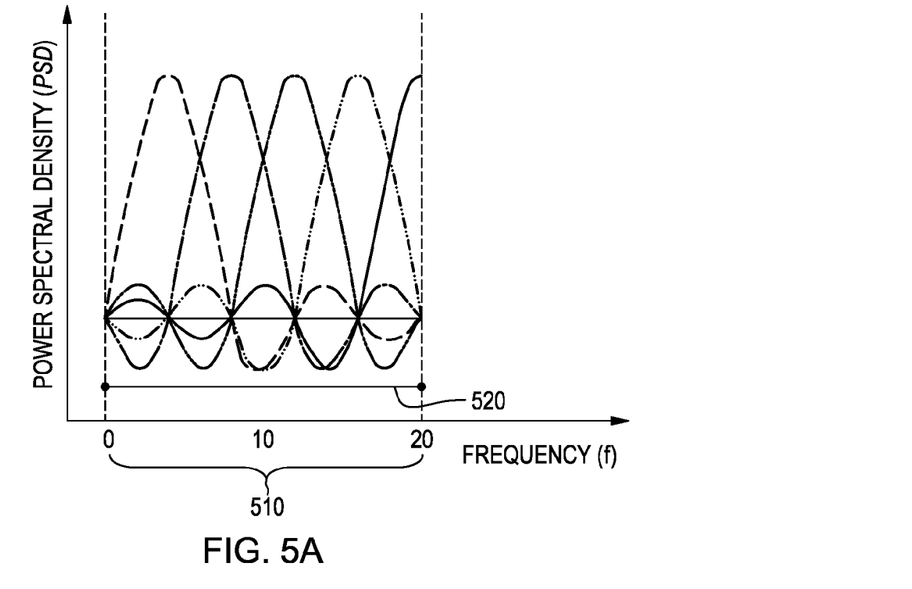
FIG. 5A is a graph illustrating the frequency (f) to power spectral density (PSD) of an exemplary test signal.
Figure 5B:
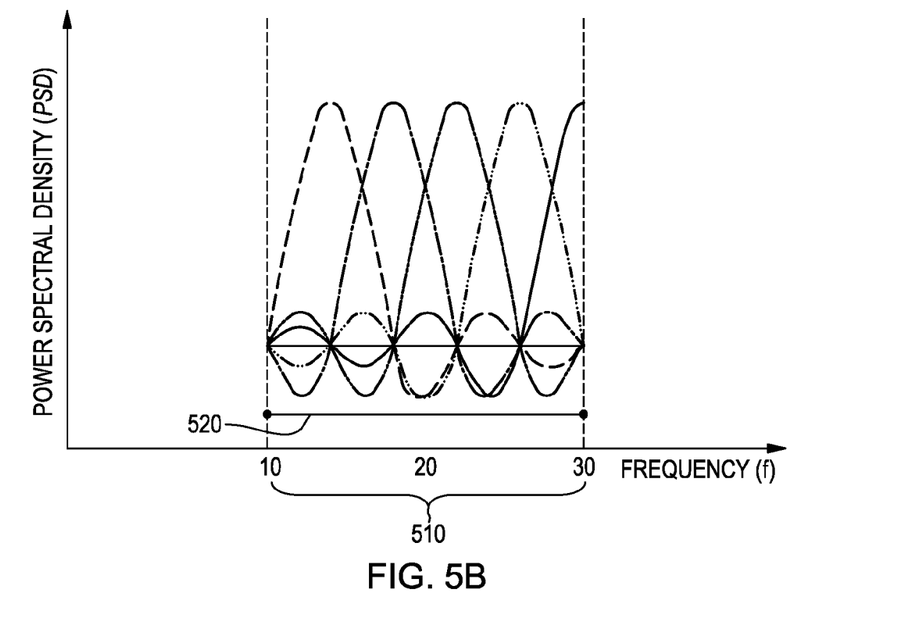
FIG. 5B is a graph illustrating a shift in the frequency (f) to power spectral density (PSD) graph of FIG. 5A.

For example, if the operational wideband of the device under test 150 is 10 MHz to 30 MHz and if the multi-tone test signal generated by the test signal generator 120 has a wideband 510 that extends from 0 MHz to 20 MHz (i.e., has a bandwidth 520 of 20 MHz and a first central frequency of 10 MHz) (as shown in FIG. 5A), the first shifter 140 can shift (i.e., up-convert) the wideband 510 of the multi-tone test signal so that it extends from 10 MHz to 30 MHz and, thereby so that it has a second central frequency of 20 MHz but continues to have a bandwidth 520 of 20 MHz (as shown in FIG. 5B). After the device under test 150 processes the up-converted test signal, the second shifter 160 can shift (i.e., down-convert) the wideband of the output signal back so that its central frequency is 10 MHz prior to being analyzed by the analyzer 180.

A shifter capable of shifting (i.e., up-converting or down-converting) the wideband of a multi-tone signal can comprise, for example, a combination of a digital controlled oscillator and a multiplier (i.e., a mixer). Such shifters are well-known in the art and, thus, the details of such shifters are omitted from this specification in order to allow the reader to focus on the salient aspects of the embodiments.

Figure 6:
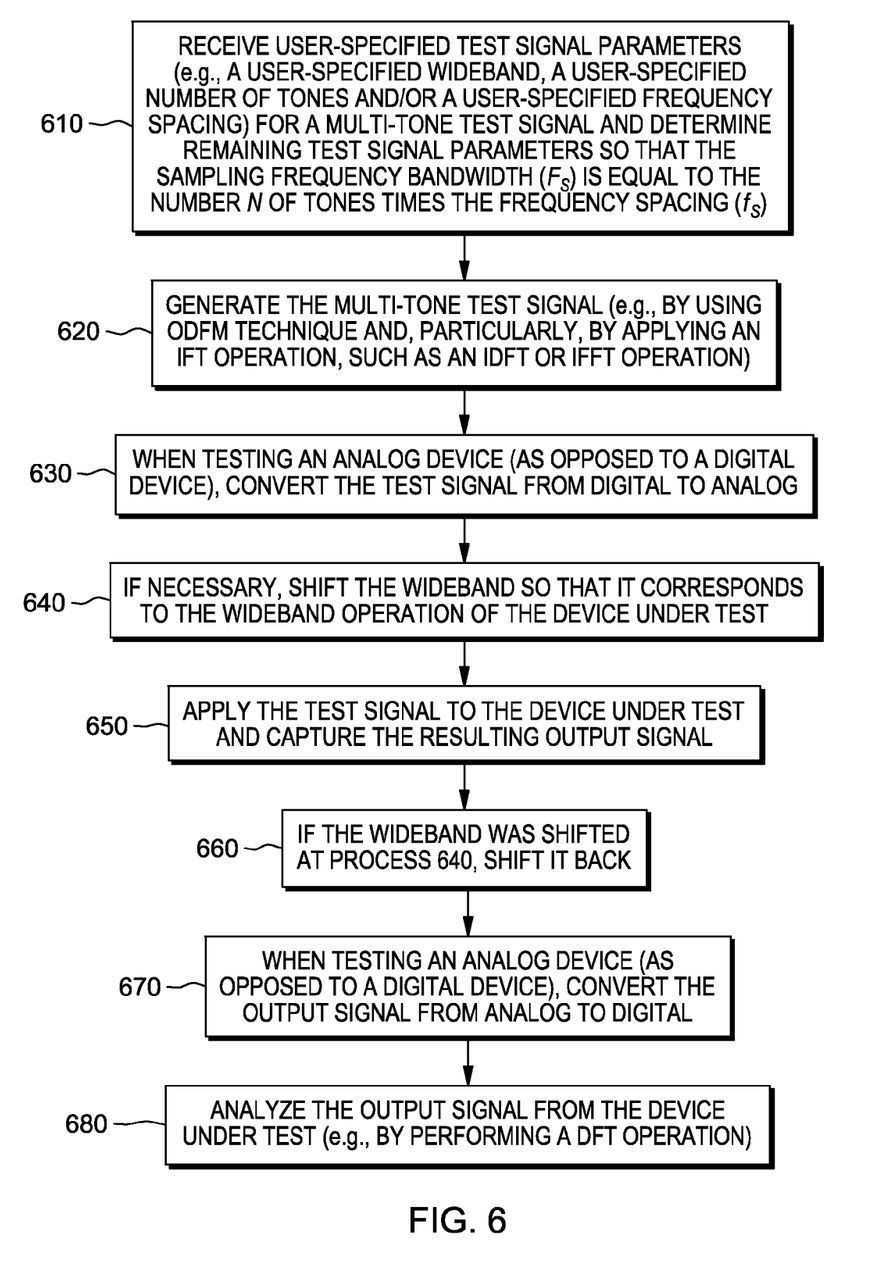
FIG. 6 is a flow diagram illustrating an embodiment of a circuit testing method.

Referring to FIG. 6 in combination with FIG. 1, also disclosed herein are embodiments of a circuit testing method and, particularly, embodiments of a method for testing a device 150 comprising a component of a circuit. This circuit can have wideband (i.e., at bandwidths of 500 kHz to 20 GHz) or ultra-wideband (i.e., 20 GHz and beyond) operation and the device under test 150 can, for example, comprise a band-pass filter, such as a low band-pass finite impulse response (FIR) filter that blocks relatively high frequencies or a high band-pass filter that blocks relatively low frequencies.

The method embodiments can comprise receiving, from a user via a user interface device 110, one or more test signal parameters for a desired multi-tone test signal (i.e., a multi-subcarrier test signal or a frequency agile test signal) (610). These received test signal parameters may vary depending upon the type of device under test and the desired performance parameters thereof. Specifically, these received test signal parameters can comprise a user-specified wideband (i.e., a user specified range of frequencies), a user-specified number of tones, and/or a user-specified amount of spacing between adjacent tones so that the tones within the test signal will account for the full range of frequencies with the wideband operation of that device under test. Those skilled in the art will recognize that a wideband is a specific range of operating frequencies and the bandwidth of the wideband is the difference between the highest and lowest frequencies in that range.

Next, the method embodiment generating, e.g., by a programmable test signal generator 120, a test signal and, particularly, a digital test signal, based on the user-specified test signal parameters such that the resulting test signal has a multiple tones (i.e., has multiple subcarriers), which are uniformly distributed across a wideband having a specific bandwidth (620). In one embodiment, such a multi-tone test signal can be generated by using an orthogonal frequency-division multiplexing (OFDM) spread spectrum technique and, particularly, by performing an inverse Fourier transform (IFT) operation, such as an inverse discrete Fourier transform (IDFT) or an inverse fast Fourier transform (IFFT), as described in detail above with regard to the system embodiments.

An exemplary test signal 200 that can be generated in this manner is illustrated in the graph of FIG. 2. This test signal 200 has multiple tones and, particularly, a number N of tones uniformly distributed across a wideband 210 (i.e., a range of frequencies) having a specific bandwidth 220. That is, each tone 1 to N is separated from adjacent tones by the same frequency spacing ($f_a$) 230 (i.e., tone 1 is separated from tone 2 by frequency spacing 230; tone 2 is separated from tone 3 by the same amount of frequency spacing 230; and so on). Thus, the bandwidth 220 (also referred to herein as the sampling frequency bandwidth ($F_s$)) of the wideband 210 can be expressed as $F_s=f_a*N$. In one embodiment, the magnitude 240 of each of the multiple tones 1 to N can be the same (as shown in FIG. 2 and discussed in detail above). Alternatively, the magnitude of any one or more of the tones 1 to N may be varied (i.e., at least two of the tones may have different magnitudes), e.g., using customized input data vector generation or other modulation schemes, to allow for a more complex analysis of the resulting frequency response of the device under test.

The multi-tone test signal can then be applied to the device under test 150, which can process the multi-tone test signal (e.g., which can filter the multi-tone test signal in the case of a pass-band filter) and, in response, can output a unique output signal (650).

Finally, the output signal from the device under test 150 and, particularly, the tones thereof can be analyzed (e.g., by an analyzer 180) in order to determine the various frequency responses associated with each of the tones (680). Specifically, the analysis at process 680 can include, but is not necessarily limited to, frequency spectrum, amplitude and phase analyses. For example, as discussed in detail above with regard to the system embodiments, a discrete Fourier transform (DFT) operation can be performed at process 680 on the output signal so that the frequency response at each tone (i.e., at each sub-carrier frequency) within the wideband can be characterized concurrently and rapidly. Those skilled in the art will recognize that, since the technique for generating a test signal, as described above, is performed such that the sampling frequency bandwidth ($F^s$) equals the total signal bandwidth, the Nyquist frequency (i.e., the highest frequency that can be coded at a given sampling rate in order to be able to fully reconstruct the signal) will be halved. However, since a property of the resulting test signal is also frequency orthogonality or zero inter-carrier interference, the frequency response of the device under test at the tone frequency points can still be characterized correctly by performing the above-mentioned discrete Fourier transform (DFT) operation.

As described above, the test signal generated at process 620 can be a digital test signal. This digital test signal can be applied at process 650 directly to a device under test 150 and, particularly, directly to a digital device. Furthermore, the output signal output from the digital device can comprise a digital output signal that can be directly captured and analyzed at process 680. However, optionally, the method embodiments can comprise additional process steps performed with respect to the multi-tone test signal prior to application to the device under test 150 at process 650 and with respect to the output signal prior to analysis at process 680, as necessary, in order to allow for testing when the device under test 150 is an analog device as opposed to a digital device. Specifically, in order to accommodate testing of an analog device (e.g., an analog band-pass filter), additional process steps must be incorporated into the test method. For example, the multi-tone test signal generated at process 620 must be converted from a digital test signal into an analog test signal prior to application to an analog device under test (630). The analog device under test can then process the analog test signal and, in response to the analog test signal, can output an analog output signal at process 650. Then, prior to capture and analysis at process 680, the analog output signal can be converted into a digital output signal (670).

Additionally, as described above, the multi-tone test signal generated at process 620 can have a desired wideband that corresponds to the wideband operation of the specific device under test. However, alternatively, as a function of the capabilities of the test signal generator 120, the multi-tone test signal may be generated at process 620 so that it has a specific bandwidth and, particularly, the same bandwidth as that of the wideband operation of the device under test), but not necessarily the same wideband. In this case, additional processes can be performed in order to shift the wideband of the test signal and output signals, as necessary, to allow for testing within the desired wideband.

Specifically, as discussed above, the wideband of the multi-tone test signal as generated at process 620 can have a specific bandwidth. It can further have a first central frequency (i.e., a frequency point at the center of the wideband). Before this test signal is applied to the device under test 150 at process 650, the wideband of the multi-tone test signal can be shifted (e.g., by a first shifter 140 connected between the programmable test signal generator 120 or, if applicable, the digital-to-analog converter, and the device under test 150) so that it has a second central frequency, which corresponds to the central frequency of the wideband operation of the device under test 150 (640). Additionally, before the output signal from the device under test 150 is analyzed by the analyzer 180 at process 680, the wideband of the output signal can be shifted (e.g., by a second shifter 160 can be connected between the device under test 150 and the analog-to-digital converter 170, if applicable, or the analyzer 180) so that it has the same central frequency as the originally generated test signal (i.e., the first central frequency)(660).

For example, if the operational wideband of the device under test 150 is 10 MHz to 30 MHz and if the multi-tone test signal generated by the test signal generator 120 has a wideband 510 that extends from 0 MHz to 20 MHz (i.e., has a bandwidth 520 of 20 MHz and a first central frequency of 10 MHz) (as shown in FIG. 5A), the wideband 510 of the multi-tone test signal can be shifted (i.e., up-converted) at process 640 so that it extends from 10 MHz to 30 MHz and, thereby so that it has a second central frequency of 20 MHz but continues to have a bandwidth 520 of 20 MHz (as shown in FIG. 5B). After the device under test 150 processes the up-converted test signal at process 650, the wideband of the output signal can be shifted (i.e., down-converted) at process 660 so that its central frequency is 10 MHz prior to being analyzed at process 680.

Also disclosed herein are embodiments of a non-transitory program storage device (i.e., a computer program product). This program storage device can be readable by a computer and, particularly, readable by a computer processor incorporated into the programmable test signal generator and can tangibly embody (i.e., store) a program of instructions that is executable by the computer processor computer in order to perform the above-described method embodiments and, particularly, in order to cause the test signal generator to generate a multi-tone test signal for application to a device under test, as discussed in detail above.

Specifically, as will be appreciated by one skilled in the art given above-description of the method and system, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a program storage device (i.e., a computer program product) embodied in one or more computer readable medium(s) having computer readable program code embodied thereon.

Any combination of one or more computer readable medium(s) may be utilized. The computer readable medium may be a non-transitory computer readable storage device or a computer readable signal medium. A non-transitory computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the non-transitory computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

As mentioned above, the computer readable medium can alternatively comprise a computer readable signal medium that includes a propagated data signal with computer readable program code embodied therein, for example, in baseband or as part of a carrier wave. Such a propagated signal may take any of a variety of forms, including, but not limited to, electro-magnetic, optical, or any suitable combination thereof. This computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the disclosed embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the disclosed embodiments are described above with reference to flowchart illustrations and/or block diagrams of methods, apparatus (systems) and computer program products. It will be understood that each block of the flowchart illustrations and/or D-2 block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments herein. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be understood that the terminology used herein is for the purpose of describing particular embodiments only and is not intended to be limiting. As used herein, the singular forms "a", "an" and "the" are intended to include the plural forms as well, unless the context clearly indicates otherwise. It should further be understood that the terms "comprises", "comprising", "included", and/or "including", when used in this specification, specify the presence of stated features, integers, steps, operations, elements, and/or components, but do not preclude the presence or addition of one or more other features, integers, steps, operations, elements, components, and/or groups thereof. It should further be understood that corresponding structures, materials, acts, and equivalents of all means or step plus function elements in the claims below are intended to include any structure, material, or act for performing the function in combination with other claimed elements as specifically claimed. Finally, it should be understood that the above-description of the embodiments was presented for purposes of illustration and was not intended to be exhaustive or limiting. Many modifications and variations will be apparent to those of ordinary skill in the art without departing from the scope and spirit of the disclosed embodiments.

Therefore, disclosed above are embodiments of a circuit testing system and an associated method that incorporate a programmable test signal generator capable of generating a test signal that has multiple tones uniformly distributed across a wideband with a specific bandwidth such that adjacent tones are all separated by a same frequency spacing. This test signal can be generated based on at least one user-specified test signal parameter and using, for example, an orthogonal frequency-division multiplexing (OFDM) spread spectrum technique. Once generated, this test signal can be processed (e.g., converted from digital to analog or shifted to a different wideband having the same bandwidth), as necessary, so that it is suitable for application to the specific device under test and so that the tones account for the full range of frequencies with the wideband operation of that device under test. Then, the multi-tone test signal can be applied to the device under test and the output signal from the device under test can be captured. The resulting output signal can be processed, as necessary (e.g., converted back to digital or shifted back to the initial wideband) and then analyzed. Specifically, the tones of this output signal can be analyzed in order to determine the various frequency responses associated with each of the tones. Consequently, the embodiments allow the full frequency bandwidth of the device under test to be characterized in a minimal amount of time and without a significant increase in hardware.

The embodiments further provide increased flexibility and functionality. Specifically, they provide increased flexibility because the test signal generator is a programmable digital structure that uses OFDM technology and, thereby allows for selective tuning of the test signal simply based on changes in user-specified test signal parameters. Furthermore, they provide increased flexibility because they incorporate additional components (e.g., a digital to analog converter, an analog to digital convert and wideband shifters) and/or process steps (e.g., digital to analog test signal conversion, analog to digital output signal conversion, and wideband shifting) that allow for testing of both digital and analog devices operating within various different widebands.

What is claimed is:

1. A circuit testing system comprising:
a programmable test signal generator generating a test signal having multiple tones uniformly distributed across a wideband having a specific bandwidth such that, within said wideband, each tone of said multiple tones is separated from adjacent tones by a same amount of frequency spacing, said test signal generator generating said test signal based on at least one user-specified test signal parameter; and
an analyzer analyzing an output signal from a device under test processing said test signal to determine frequency responses associated with each of said multiple tones in said wideband,
said device under test comprising a band-pass filter, said processing of said test signal by said band-pass filter comprising blocking at least some frequencies in said wideband, and said frequency responses being used to characterize performance of said band-pass filter,
said programmable test signal generator further generating said test signal such that said wideband has a first central frequency, and said system further comprising:
a first shifter connected between said programmable test signal generator and said device under test, said first shifter shifting said test signal such that said wideband has a second central frequency different from said first central frequency; and
a second shifter connected between said device under test and said analyzer, said second shifter shifting said output signal such that a wideband of said output signal has said first central frequency.

2. The circuit testing system of claim 1,
said programmable test signal generator performing an inverse discrete Fourier transform (IDFT) operation in order to generate said test signal, and
said analyzer performing a discrete Fourier transform (DFT) operation on said output signal in order to determine said frequency responses associated with each of said multiple tones.

3. The circuit testing system of claim 1, said programmable test signal generator further generating said test signal such that all of said multiple tones have a same magnitude.

4. The circuit testing system of claim 1, said programmable test signal generator further generating said test signal such that at least two of said multiple tones have different magnitudes.

5. The circuit testing system of claim 1,
said specific bandwidth being equal to the number of said multiple tones times said frequency spacing between said adjacent tones, and
said at least one user-specified test signal parameter comprising at least one of a user-specified number of tones, a user-specified spacing between adjacent tones and a user-specified wideband.

6. A circuit testing system comprising:
a programmable test signal generator generating, based on at least one user-specified test signal parameter, a digital test signal having multiple tones uniformly distributed across a wideband having a specific bandwidth such that, within said wideband, each tone of said multiple tones is separated from adjacent tones by a same amount of frequency spacing;
a digital-to-analog converter converting said digital test signal into an analog test signal;
an analog-to-digital converter converting an analog output signal from an analog device under test processing said analog test signal into a digital output signal; and
an analyzer analyzing said digital output signal in order to determine frequency responses associated with each of said multiple tones in said wideband,
said device under test comprising a band-pass filter, said processing of said test signal by said band-pass filter comprising blocking at least some frequencies in said wideband, and said frequency responses being used to characterize performance of said band-pass filter,
said programmable test signal generator further generating said digital test signal such that said wideband has a first central frequency, and said system further comprising:
a first shifter connected between said digital-to-analog converter and said device under test, said first shifter shifting a wideband of said analog test signal such that said analog test signal has a second central frequency; and
a second shifter connected between said device under test and said analog-to-digital converter, said second shifter shifting said analog output signal such that a wideband of said analog output signal has said first central frequency.

7. The circuit testing system of claim 6,
said programmable test signal generator performing an inverse discrete Fourier transform (IDFT) operation in order to generate said digital test signal, and
said analyzer performing a discrete Fourier transform (DFT) operation on said digital output signal in order to determine said frequency responses associated with each of said multiple tones.

8. The circuit testing system of claim 6, said programmable test signal generator further generating said digital test signal such that all of said multiple tones have a same magnitude.

9. The circuit testing system of claim 6, said programmable test signal generator further generating said digital test signal such that at least two of said multiple tones have different magnitudes.

10. The circuit testing system of claim 6,
said specific bandwidth being equal to the number of said multiple tones times a said frequency spacing between said adjacent tones, and
said at least one user-specified test signal parameter comprising at least one of a user-specified number of tones, a user-specified spacing between adjacent tones and a user-specified wideband.

11. A circuit testing method comprising:
generating, by a circuit test system based on at least one user-specified test signal parameter, a test signal having a multiple tones uniformly distributed across a wideband having a specific bandwidth such that, within said wideband, each tone of said multiple tones is separated from adjacent tones by a same amount of frequency spacing;
applying, by said circuit test system, said test signal to a device under test, said device under test processing said test signal and generating an output signal; and
analyzing, by said circuit test system, said output signal from said device under test to determine frequency responses associated with each of said multiple tones in said wideband,
said device under test comprising a band-pass filter, said processing of said test signal by said band-pass filter comprising blocking at least some frequencies in said wideband, and said frequency responses being used to characterize performance of said band-pass filter,
said generating of said test signal further being performed such that said wideband has a first central frequency, and said method further comprising:
before said applying of said test signal to said device under test, shifting said wideband such that said wideband has a second central frequency; and
before said analyzing of said output signal, shifting said output signal such that a wideband of said output signal has said first central frequency.

12. The method of claim 11,
said generating of said test signal comprising performing an inverse discrete Fourier transform (IDFT) operation, and
said analyzing of said output signal comprising performing a discrete Fourier transform (DFT) operation on said output signal in order to determine said frequency responses associated with each of said multiple tones.

13. The method of claim 11, said generating of said test signal being performed such that all of said multiple tones have a same magnitude.

14. The method of claim 11, said generating of said test signal being performed such that at least two of said multiple tones have different magnitudes.

15. The method of claim 11,
said specific bandwidth being equal to the number of said multiple tones times a said frequency spacing between said adjacent tones, and
said at least one user-specified test signal parameter comprising at least one of a user-specified number of tones, a user-specified spacing between adjacent tones and a user-specified wideband.

16. A circuit testing method comprising:

generating, by a circuit test system based on at least one user-specified test signal parameter, a digital test signal having multiple tones uniformly distributed across a wideband having a specific bandwidth such that, within said wideband, each tone of said multiple tones is separated from adjacent tones by a same amount of frequency spacing;

converting, by said circuit test system, said digital test signal into an analog test signal;

applying, by said circuit test system, said analog test signal to an analog device under test, said analog device under test processing said analog test signal and generating an analog output signal;

converting, by said circuit test system, said analog output signal from said analog device under test into a digital output signal; and analyzing, by said circuit test system, said digital output signal in order to determine frequency responses associated with each of said multiple tones in said wideband, said device under test comprising a band-pass filter, said processing of said test signal by said band-pass filter comprising blocking at least some frequencies in said wideband, and said frequency responses being used to characterize performance of said band-pass filter, said generating of said digital test signal further being performed such that said wideband has a first central frequency, and said method further comprising:

before said applying of said test signal to said device under test, shifting a wideband of said analog test signal such that said analog test signal has a second central frequency; and before said analyzing of said output signal, shifting said analog output signal such that a wideband of said analog output signal has said first central frequency.

17. The method of claim 16, said generating of said digital test signal comprising performing an inverse Fourier transform (IFT) operation, and said analyzing of said digital output signal comprising performing a discrete Fourier transform (DFT) operation on said digital output signal in order to determine said frequency responses.

18. The method of claim 16, said generating of said test signal being performed such that all of said multiple tones have a same magnitude.

* * * * *